United States Patent [19]

Ghezzo

[11] 4,057,895

[45] Nov. 15, 1977

[54] METHOD OF FORMING SLOPED MEMBERS OF N-TYPE POLYCRYSTALLINE SILICON

[75] Inventor: Mario Ghezzo, Ballston Lake, N.Y.

[73] Assignee: General Electric Company, Schenectady, N.Y.

[21] Appl. No.: 724,988

[22] Filed: Sept. 20, 1976

[51] Int. Cl.² .............................................. H01L 7/50
[52] U.S. Cl. ...................................... 29/591; 29/580; 156/628
[58] Field of Search ................. 29/580, 591; 156/628, 156/657

[56] References Cited

U.S. PATENT DOCUMENTS 3,892,606   7/1975   Chappelow et al. .............. 29/591 X Primary Examiner—Gerald A. Dost
Attorney, Agent, or Firm—Julius J. Zaskalicky; Joseph T. Cohen; Jerome C. Squillaro

[57] ABSTRACT

A method of forming a conductive member of N-type conductivity polycrystalline silicon on the surface of an insulating substrate with at least one side thereof sloping gradually to the surface of the insulating substrate utilizing the location dependent diffusivity of doping impurities in the polycrystalline silicon formed on the surface of the insulating substrates and also utilizing the etch inhibiting properties of polycrystalline silicon doped with boron impurities.

8 Claims, 10 Drawing Figures

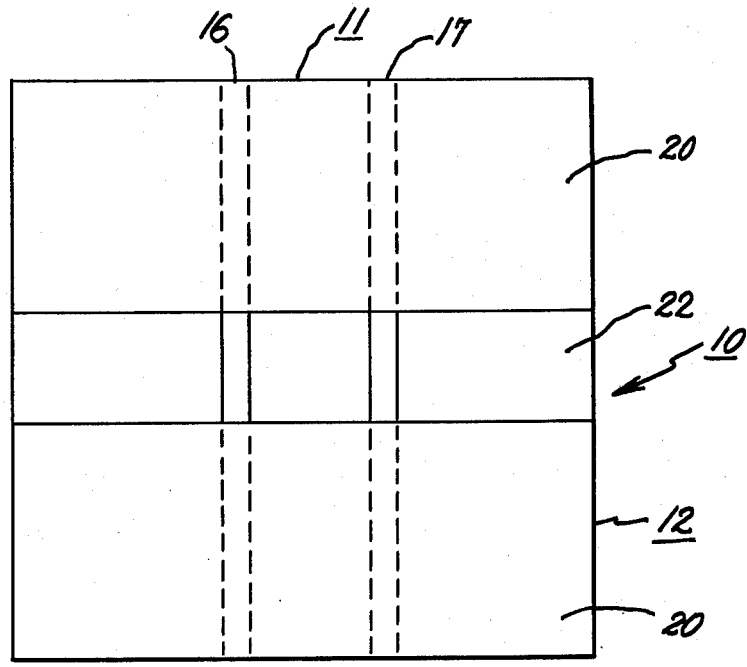
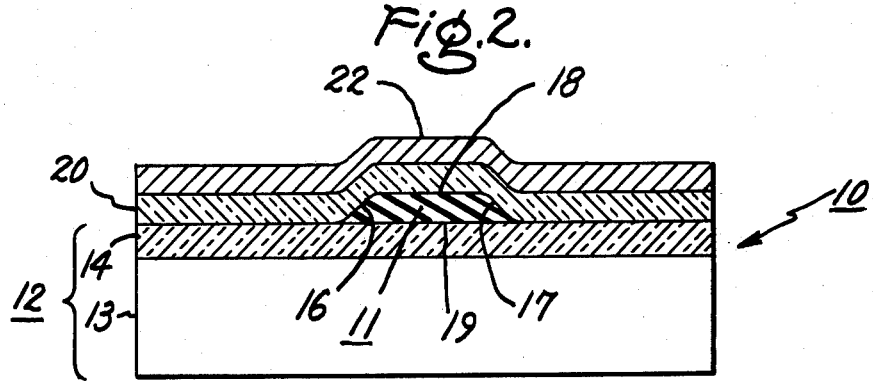

METHOD OF FORMING SLOPED MEMBERS OF N-TYPE POLYCRYSTALLINE SILICON

The present invention relates in general to methods of forming conductive members of N-type conductivity polycrystalline silicon having sloping sides.

In the fabrication of various integrated circuit semiconductor devices such as imaging and memory arrays, signal processing circuits and the like, electrodes and lines formed of P-type and N-type conductivity polycrystalline silicon are used both in devices involving a single level of electrodes and interconnections and also involving multi-levels of electrodes and interconnections. The polycrystalline silicon material is desirable as an electrode and an interconnection line material because it is transparent and also because the material itself and the processing thereof is compatible with the making of integrated circuit devices on silicon substrates as well as for other reasons. In the fabrication of integrated circuit devices having two levels of electrodes and interconnections, the first level of metallization is usually constituted of a layer of suitably doped polycrystalline silicon initially formed on the insulating layer of the substrate and then suitably patterned using photolithographic masking and etching techniques to provide the desired form of the electrodes and interconnections. Thereafter, an interlevel layer of insulation, such as a layer of silicon dioxide or silicon nitride, is deposited or grown over the first level of metallization to a suitable thickness and another conductive material such as suitably doped polycrystalline silicon or aluminum is deposited on the interlevel layer of insulation. The second level of metallization is suitably formed using photolithographic masking and etching techniques to provide the desired pattern of electrodes and interconnecting lines between electrodes.

In the formation of the metallization pattern in the first layer of conductive polycrystalline silicon it is highly important to avoid sharp edges and hollows in the resultant patterned layer. Where the first level of polycrystalline layer is etched with sharp right angle edges in the surface of the layer remote from the insulating substrate, a sharp transition is produced, and likewise in the surface of the layer adjacent the insulating substrate a hollow is produced. In the deposition of the interlevel layer of insulation, such as silicon dioxide or silicon nitride, the insulating material preferentially deposits on the exposed outer portions of the polycrystalline pattern and is somewhat inhibited from depositing uniformly in the hollow corners of the resultant body. Thus, the sharp transitions in the contour of the underlying first level of metallization of polycrystalline silicon are largely retained in the outer surface of the interlevel layer of insulation. In the deposition of an electrically conductive material, such as aluminum, on the outer surface of the interlevel layer of insulation to form the second level of metallization, the conductive material preferentially deposits on the protruding portions of the interlevel layer of insulation. Thus, in the hollows or crevices of the interlevel layer of insulation overlying the hollows at the edges of the polycrystalline silicon pattern, forming the first level of metallization, nonuniform thickness of conductive material is deposited and these hollows may have voids. When the layer of conductive material is etched to form a pattern, the material located in the hollow is etched at a faster rate than elsewhere even if covered by a portion of a masking layer, because the etchant penetrates at first into the hollows, as the material is thinner at these locations, and then attacks the material from the underside as well as from the top side, spreading laterally into the masked portions from edges thereof by capillary action. This action results in interconnection lines having breaks in them or having localized high resistance sections, which will eventually break during operation due to power dissipation and overheating.

One solution to the above-mentioned problem is to provide the electrodes and lines in the first level of polycrystalline metallization with sloping sides which provide gradual transitions from one level to the other in the upper surface thereof, thereby avoiding sharp edges and deep hollows. Such structure enables the interlevel layer of insulation to be provided with uniform thickness and quality and likewise enables the second level of metallization to be laid down with uniform thickness and adhesiveness over the entire interlevel layer of insulation. One such technique for providing such conductive members of polycrystalline silicon is to utilize boron doping above a predetermined threshold level of concentration and utilizing a preferential etch such as potassium hydroxide solution which etches the undoped polycrystalline silicon at a much greater rate than it etches the boron doped polycrystalline silicon. The technique also takes advantage of the fact that the diffusivity of boron in a layer of polycrystalline silicon deposited on an insulating substrate, such as silicon dioxide, varies in inverse relationship with the distance of the polycrystalline material from the surface of the insulating layer. Thus, immersion of a polycrystalline silicon layer, doped with boron in selected regions, in the potassium hydroxide etch will etch away the undoped polycrystalline silicon to leave on the substrate the regions of boron doped polycrystalline material having the sloping sides corresponding to the boron concentration profile.

The usefulness of the electrodes and conductive lines constituted of boron doped polycrystalline material is limited in that the P-type conductivity produced thereby is considerably less than the conductivity of polycrystalline silicon doped with a suitable donor dopant, such as phosphorus. While utilization of a donor doping agent, such as phosphorus, above, increases the conductivity of the material, it unfortunately tends to enhance the etching of the polycrystalline silicon rather than retarding it.

Accordingly, the present invention is directed to provide conductive members of polycrystalline silicon of both high conductivity and with sloping sides.

In carrying out the present invention in accordance with an illustrative embodiment thereof, there is provided a substrate of an insulating material on which has been formed a layer of polycrystalline silicon. A region of N-type and of high conductivity including boron atoms therein is formed on the insulating substrate. The N-type conductivity region extends from the exposed surface of the layer of polycrystalline silicon to the opposite surface thereof. The region has at least one generally planar side portion gradually sloping from the exposed surface of the layer of polycrystalline silicon to the opposite surface thereof to make a small acute angle with the base of the region lying on the surface of the insulating substrate. The layer of polycrystalline silicon is etched with an etch which etches polycrystalline silicon containing boron even though including greater relative quantity of donor impurities at a rate substantially less than the rate at which it etches polycrystalline silicon not containing boron for a period of time to remove the portion of the layer of polycrystalline silicon not containing boron. Thus, the region of the polycrystalline silicon layer having the aforementioned boron concentration profile remains to provide a conductive member of both high conductivity and with sloping sides.

The novel features which are believed to be characteristic of the present invention are set forth with particularity in the appended claims. The invention itself together with further objects and advantages thereof may best be understood by reference to the following description taken in connection with the accompanying drawings wherein:

FIG. 1 is a plan view of a composite body which includes an insulating substrate on which a first level of metallization of polycrystalline silicon has been formed followed by a first interlevel layer of insulation, and thereafter followed by a second level of metallization in accordance with the present invention.

FIG. 2 is the cross-section of FIG. 1 showing the profile of a section of an interconnection conductor in the first level of metallization.

Figure 3A:
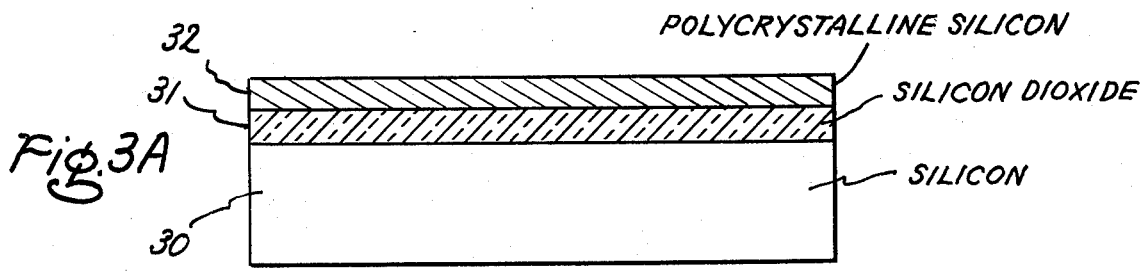
FIGS. 3A-3D show cross-sections of structures representing successive steps in practicing the method of the invention in accordance with one embodiment thereto.

Referring now to FIG. 1, there is shown a composite body 10 illustrating a first level metallization 11 of doped polysilicon material made in accordance with the present invention. The composite body 10 includes a substrate 12 constituted of a substrate layer 13 of silicon on which a layer 14 of silicon dioxide or silicon nitride or a combination thereof has been formed. The silicon dioxide layer 14 may represent either gate or field oxide of an integrated circuit, such as an imaging array, a memory array or a signal processing circuit. Overlying the insulating surface 12 is provided a conductive member 11 of N-type conductivity polycrystalline silicon having sloping side portions 16 and 17. In accordance with the present invention the conductive member 11 is formed by initially providing a layer of polycrystalline silicon on the surface of the insulating substrate to a suitable thickness, for example, 5000 Angstroms. Thereafter forming a region 11 of N-type conductivity which includes boron atoms or impurities of at least a minimum concentration in excess of $10^{18}$ atoms per cubic centimeter and extends from the exposed surface of the layer of polycrystalline silicon to the opposite surface thereof adjacent the surface of the silicon dioxide layer 14. The region 11 is provided with gradually sloping side portions 16 and 17 in a manner to be explained below. The side portions 16 and 17 gradually slopes from the upper base 18 of the region 11 in the upper surface of the layer of the polycrystalline silicon to the lower base 19 in the lower surface of the layer of polycrystalline silicon and makes an acute angle with the lower base 19. Preferably the acute angle should be less than about 45° to avoid the problems such as described earlier. However, the acute angle should not be so small as to significantly increase the substrate area required for the integrated circuit. Thereafter the layer of polycrystalline silicon is etched with an etch which etches polycrystalline silicon containing boron in concentrations above the aforementioned minimum concentration at a rate substantially less than the rate at which it etches polycrystalline silicon not containing boron for a period of time to remove the portion of the layer of polycrystalline silicon not containing boron. Thus, the region 11 of N-type conductivity remains, as desired. The manner of forming the N-type conductivity region 11 including boron atoms having the concentration profile described above and the manner of etching the polycrystalline layer to provide the resultant conductive member 11 on the insulating substrate 12 will be described in further detail in connection with FIGS. 3A-3D and FIGS. 4A-4D in the examples below.

After the first level of metallization represented by conductive member 11 has been formed, an interlevel layer 20 of insulating material, for example, silicon dioxide of suitable thickness, is provided over the first level of metallization. The interlevel layer 20 of insulation takes on the pattern provided by the first level of metallization including the elevations and depressions therein. The smooth transitions or slopes from the upper surface of the first level of metallization to the upper surface of the insulating layer 14 is duplicated in the overlying interlevel insulating layer 20. Accordingly, as the first layer of metallization is free of right angle protuberances or depressions, essentially uniform deposition and adhesion of the second interlevel layer of insulation is obtained. Similarly, a second level of metallization replicates the pattern in the interlevel layer of insulation. For example, when aluminum is evaporated onto the interlevel layer of insulation a second level of metallization is obtained with essentially uniform thickness and adhesion. Accordingly, when photolithographic masking and etching is utilized to form a pattern in the second level of metallization, such as the single crossover conductor 22, the metal layer is essentially uniformly etched to provide a conductive member of uniform thickness and width.

If the conductive member 11 of polycrystalline silicon had sides which extended at right angles to the surface of the layer 14 of insulation not only would the deposition of the interlevel layer 20 of insulation tend to bulge at the intersections of the sides with the upper surface of the polycrystalline silicon conductive member but would also be somewhat inhibited from deposition at the depressions or hollows located at the intersection of the sides with the upper surface of the layer 14 of insulation. The aforementioned bulges and hollows in the layer of insulation would not only be duplicated but would be accentuated in the deposition of the second layer of metallization, resulting in nonuniform thickness of the deposited layer and nonuniform adhesion including possibly voids in locations where hollows occur. Consequently, on etching a pattern in the second level of metallization, portions of the metal in the hollows would be more rapidly attacked and etched away than other portions of the layer with resultant cross-over lines or conductors reduced in cross-section as well as breaks in such lines. The existance of right angle edges in the first level of conductors also enhances the breakdown of the interlevel insulation at such edges, directly due to the smaller thickness of insulator at these locations or indirectly due to a similar effect occurring in the photosensitive masking material used to protect the interlevel insulation, while etching selective portions of it for opening contact holes to the first level metallization. Heretofore, boron doped polycrystalline silicon material has been utilized to provide conductive lines with sloping sides as polycrystalline silicon doped with boron above a certain concentration level is etched by certain etches, such as potassium hydroxide, at a much lower rate than the rate of etch of undoped polycrystalline silicon material.

The present invention extends the capability of providing gradual transitions or slopes in the sides of conductive members of polycrystalline silicon to N-type silicon material thereby enabling N-type conductivity polycrystalline silicon, having significantly higher conductivity per square than P-type conductivity polycrystalline silicon, to be utilized in electrodes and interconnection lines in integrated circuit devices.

Figure 3B:
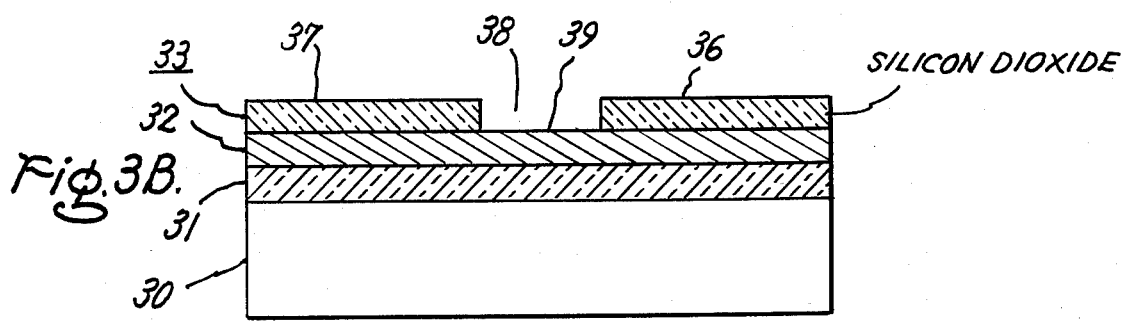
Figure 3C:
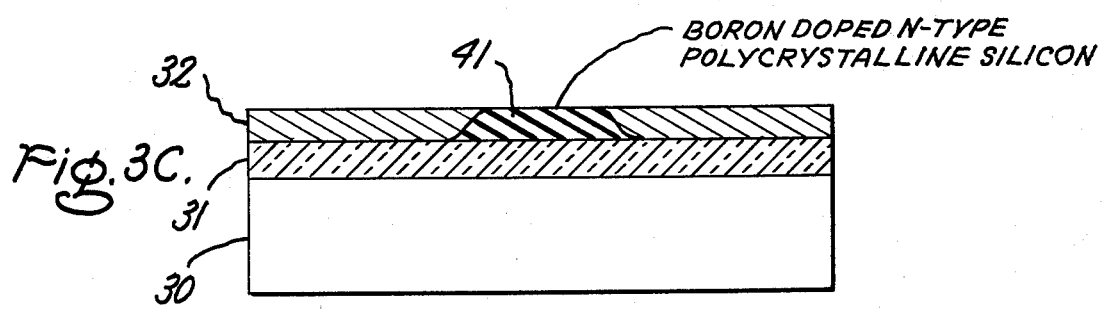
Figure 3D:
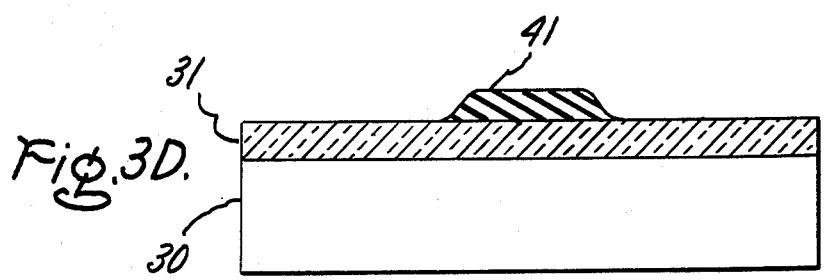

This invention will now be described in several specific examples utilizing FIGS. 3A-3D and FIGS. 4A-4D. In one example, a substrate 30 of silicon semiconductor material about 10 mils thick with a layer 31 of thermally grown silicon dioxide about 8000 Angstroms thick thereon is provided. A layer 32 of polycrystalline silicon 5000 Angstroms thick is deposited on the insulating substrate by pyrolytic decomposition of silane at 750° C in a stream of an inert carrier gas providing a body, such as shown in FIG. 3A. Thereafter, a diffusion mask 33 of silicon dioxide is formed on the layer 32 of polycrystalline silicon 6000 Angstroms thick by oxidation of silane in a stream of carrier gas while maintaining the body at a temperature of about 450° C. After densification of the layer 33 of silicon dioxide at 1000° C for 30 minutes in an inert gas, such as argon or nitrogen, the layer of silicon dioxide is patterned utilizing photolithographic masking and etching techniques to provide the mask 33 having retained portions 36 and 37 where the layer of polycrystalline silicon is to be removed, and having removed portion 38, where the layer of polycrystalline silicon is to be retained, as shown in FIG. 3B. Boron is diffused from the exposed surface 39 into the region 41 of the polycrystalline silicon layer converting it to P-type conductivity in the process. As the diffusivity of a dopant, such as boron, in a layer of polycrystalline silicon formed on a layer of silicon dioxide varies in an inverse relationship with distance of the polycrystalline material from the surface of the insulating substrate, the profile of the region containing the boron slopes gradually from the upper surface of the polycrystalline layer 32 to the upper surface of the insulating layer 31. The boron diffusion is accomplished in an open tube furnace by placing surface 39 of the polycrystalline layer 32 for 1 hour near a surface oxidized — boron nitride source maintained at 1000° C and on the downstream side of inert gas flow through the furnace. The boron concentration introduced into the polycrystalline layer can be controlled by the time and temperature of diffusion, that is, with higher temperature and greater time, higher concentrations of boron are introduced into the polycrystalline layer. The slope of the profile of the lateral diffusion of boron in the polycrystalline layer is controlled by controlling the time of anneal. Increasing the time of anneal causes greater lateral spread of the boron and hence a profile having a smaller acute angle with respect to the base of the boron containing region. After the diffusion of the boron atoms into the polycrystalline silicon layer, the borosilicate glass layer formed on the surfaces 36 and 37 during the diffusion operation by conversion of the outer surface of the masking oxide is etched away using fluoroboric acid. Phosphorus is then diffused into the exposed surface 39 of the polycrystalline silicon layer from a phosphorus oxychloride source at 1100° C for 30 minutes using a carrier gas stream with a small percentage of oxygen and partially bubbling the gas through a container filled with phosphorus oxychloride. The phosphorus diffuses into the polycrystalline silicon in the same manner as boron, i.e., phosphorus spreads out laterally and diffuses at a progressively greater rate the closer the polycrystalline silicon material is to the substrate. In view of the higher temperature utilized for the diffusion of phosphorus and the higher solid solubility of phosphorus in the polycrystalline silicon, phosphorus atoms are included in the region 41 in a concentration greater than the concentration of the boron atoms in the region 41. Consequently, N-type conductivity is imparted to the region 41 into which the phosphorus has diffused. The phosphosilicate glass formed by oxidation of the exposed surface 39 of the polycrystalline silicon layer and the portions 36 and 37 of the diffusion mask 33 are removed by immersion in a buffered hydrofluoric acid solution for as long as required, i.e., for several minutes. Thereafter, the polycrystalline silicon layer having the N-type region 41 with a boron concentration profile having sloping sides is etched by immersion of the composite body in a 40% potassium hydroxide aqueous solution by weight saturated with isopropanol at 60° C to remove the portions of the polycrystalline silicon layer not containing boron to obtain the aforementioned N-type region 41, as shown in FIG. 3D. Thereafter the composite body is rinsed and cleaned, including a boil for 5 minutes in a 40% hydrochloric acid solution to remove potassium contamination.

Figure 4A:
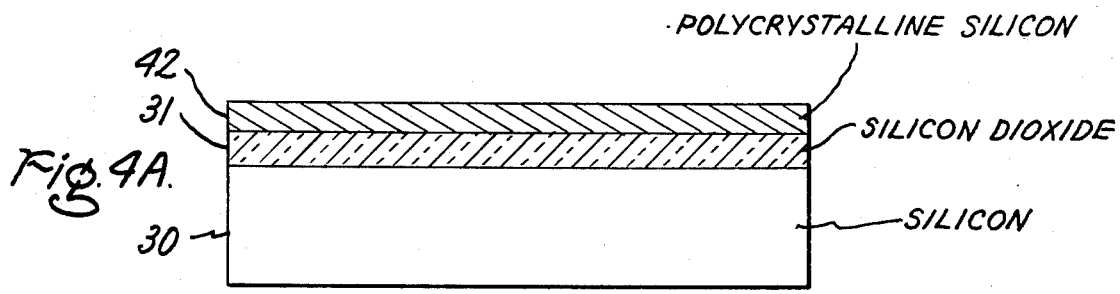
FIGS. 4A-4D show cross-sections of structures representing successive steps in practicing the method of the invention in accordance with another embodiment thereof.
Figure 4B:
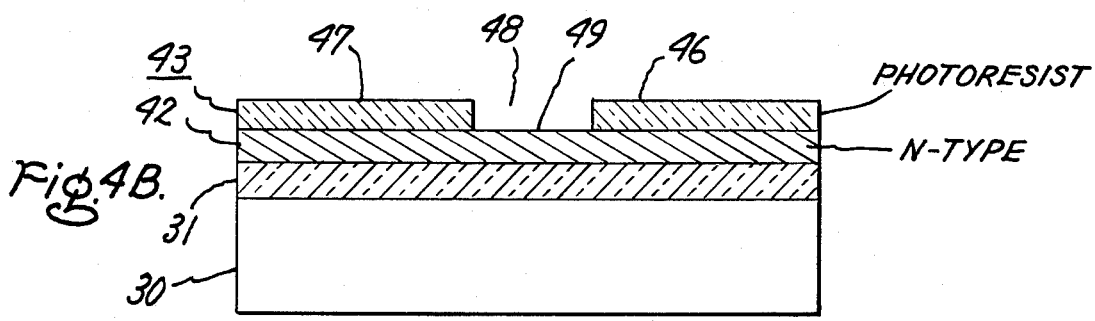
Figure 4C:
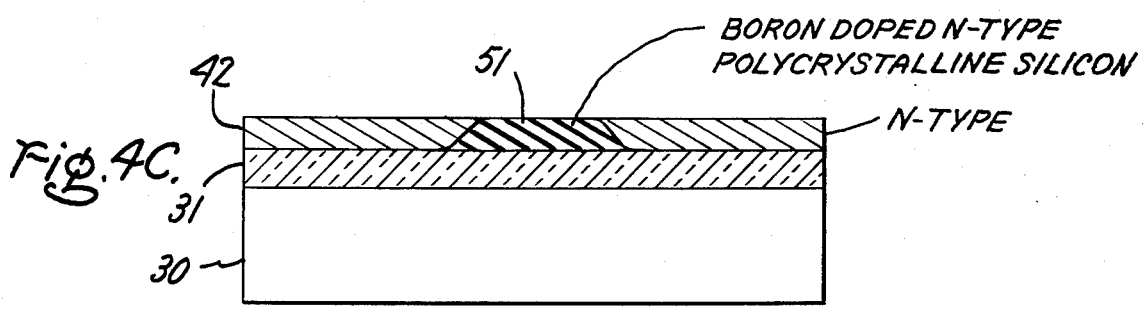
Figure 4D:
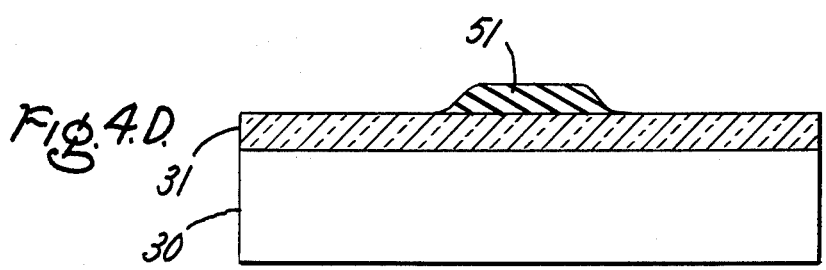

Reference is now made to FIGS. 4A-4D showing another example of the method of the present invention. In this example a substrate 30 of silicon semiconductor material 2 inches in diameter and about 10 mils thick with a layer 31 of thermally grown silicon dioxide about 8000 Angstroms thick thereon is provided. A layer 42 of polycrystalline silicon 5000 Angstroms thick is deposited on the insulating substrate by pyrolytic decomposition of silane at 750° C in a stream of an inert carrier gas. Phosphorus is then diffused into the layer of polycrystalline silicon from a phosphorus oxychloride source at 1100° C for 30 minutes using a carrier gas stream with a small percentage of oxygen and partially bubbling the gas through a container filled with phosphorus oxychloride. The phosphorus diffuses into the polycrystalline silicon layer converting it to N-type conductivity. In view of the high temperature utilized for the diffusion of phosphorus and in view of high solid solubility of phosphorus in silicon, phosphorus atoms are included in the polycrystalline silicon layer in excess of $10^{20}$ atoms per cubic centimeter. In the phosphorus diffusion step, the phosphosilicate glass formed by oxidation at the surface of the polycrystalline silicon layer is removed by immersion in a buffered hydrofluoric acid solution for as long as required, i.e., for a few minutes. Thereafter an ion implantation mask 43 of a photoresist is formed on the layer 43 of polycrystalline silicon by the usual photolithographic masking and etching techniques used in the art. The mask 43 has retained portions 46 and 47 where the layer of polycrystalline silicon is to be removed and a removed portion 48 were the layer of polycrystalline silicon is to be retained, as shown in FIG. 4B. Boron ions are then implanted into the polycrystalline silicon dioxide layer through the exposed surface 49 of layer 43. After removal of the photoresist in a suitable photoresist stripper the boron ions are diffused throughout the region 51. As the diffusivity of a dopant, such as boron, in a layer of polycrystalline silicon formed on a substrate of an insulating material such as silicon dioxide varies in an inverse relationship with distance of the polycrystalline material from the surface of the insulating substrate, the profile of the region 51 slopes gradually from the upper surface of the polycrystalline layer 42 to the upper surface of the insulating layer 31. The concentration of boron atoms introduced into the polycrystalline layer and hence into the region 51 can be controlled by controlling the ion implantation dosage. The dosage is set so that after diffusion of the boron atoms into the region 51 to form the desired profile of boron concentration therein, the resultant concentration is in excess of $10^{18}$ atoms per cubic centimeter and preferably about two orders of magnitude less than the phosphorus concentration in the region. As the phosphorus solid solubility in polycrystalline silicon at 1100° C is in excess of $10^{20}$ atoms per cubic centimeter, this result can be readily achieved. The slope of the lateral profile of boron diffusion in the polycrystalline layer is controlled by controlling the time of diffusion after ion implantation. Increasing the time of diffusion causes greater lateral spread of the boron and hence a profile having a smaller acute angle with respect to the base of the boron containing region 51. Thereafter, the polycrystalline silicon layer 42 having the N-type region 51 with a boron concentration profile having sloping sides is etched by immersion of the composite body in a 40% potassium hydroxide aqueous solution saturated with isopropanol at 60° C to remove the portions of the polycrystalline silicon layer not containing boron to the aforementioned N-type region as shown in FIG. 4D. The composite body is then rinsed and cleaned including a boil for 5 minutes in a 40% hydrochloric acid solution to remove potassium contamination.

In connection with the specific example described in connection with FIGS. 3A–3D, boron impurities were initially introduced into the polycrystalline layer and thereafter phosphorus impurities were introduced into the polycrystalline layer to form the region of N-type conductivity having the desired profile of boron concentration. It is apparent that the order of introducing the boron and phosphorus impurities could be changed. It is apparent that the formation of the desired N-type conductivity region having the desired profile of boron concentration could be arrived at by different process steps, for example, initially the polycrystalline layer of silicon could be provided with N-type conductivity by the diffusion of phosphorus impurities therein to a sufficient concentration to provide a net excess thereof after subsequent diffusion of boron impurities thereon of the requisite concentration. The phosphorus impurities instead of being incorporated into the entire layer of polycrystalline silicon could be diffused into the selected region utilizing the same diffusion mask for diffusion of boron impurities therein except that this step would be performed prior to the boron diffusion step.

While in connection with the method described in connection with FIGS. 4A–4D, initially a layer of N-type conductivity was utilized, it is apparent that a layer of essentially intrinsic conductivity polycrystalline silicon could have been used and phosphorus atoms could have been implanted into the polycrystalline layer through the removed portion of the mask either prior to or subsequent to the ion implantation of the boron atoms therethrough, and thereafter both the phosphorus and the boron atoms diffused simultaneously laterally in the polycrystalline layer to form the N-type conductivity region with the sloping profile of boron concentration. Of course, prior to the performance of the diffusion operation the photo-resist mask would have been removed.

In the method described in connection with FIGS. 4A–4D, an ion implantation mask of silicon dioxide could have been used in place of the mask constituted of a photoresist material. N-type and high conductivity could have been imparted to the desired region by ion implantation of donor atoms, such as phosphorus atoms, to the desired concentration in the polycrystalline silicon layer through the removed portion or opening in the ion implantation mask either prior to or subsequent to the boron diffusion step. Thereafter, the phosphorus atoms could be diffused to constitute the desired region of N-type and high conductivity.

It is a well known property of boron doped polycrystalline silicon that with concentrations of boron atoms in the polycrystalline silicon of less than about $2 \times 10^{18}$ atoms per cubic centimeter, the etch rate using an aqueous solution of potassium hydroxide and isopropanol, is fairly constant at about 0.20 micrometers per minute. See FIG. 10 of an article entitled "Low Temperature Growth and Properties of Polycrystalline Silicon" by Y. S. Chiang in Semiconductor Silicon 1973, edited by H. R. Huff and R. R. Burgess and published by The Electrochemical Society, Inc., Princeton, N. J. At a boron concentration in excess of this threshold level the etch rate decreases substantially in an inverse relationship so that with a boron concentration of $2 \times 10^{19}$ atoms per cubic centimeter the etch rate is about 0.03 micrometers per minute, that is, for an increase in the boron concentration from the threshold level by a factor of 10 the etch rate decreases by a factor of 10. The corresponding etch rates of intrinsic polycrystalline silicon and donor activated polycrystalline silicon are substantially the same as boron doped polycrystalline silicon in concentrations of less than the aforementioned threshold concentration of $2 \times 10^{18}$ atoms per cubic centimeter. This is true for even very high concentrations of the donor dopants or activators and is particularly true of phosphorus. As a matter of fact the presence of phosphorus in the polycrystalline silicon appears to enhance the etching rate.

Utilization of phosphorus as the donor impurity is particularly desirable in view of the fact that phosphorus diffuses into polycrystalline silicon at about the same rate that boron does. Accordingly, comparable times are involved in the diffusion thereof into the polycrystalline silicon. Phosphorus is also a particularly desirable and advantageous donor material in that it also has a higher solid solubility in polycrystalline silicon than boron. It has been found that the etch inhibiting properties of boron doped polycrystalline silicon are not inhibited by the presence of donor activators such as phosphorus therein even in concentrations very substantially greater than the concentration of the boron atoms in the polycrystalline silicon.

While the invention is particularly applicable to the formation of N-type conductivity members of polycrystalline silicon on insulating substrates of silicon dioxide, other insulating substrates may as well be used, for example, insulating substrates of silicon nitride or aluminum oxide.

While the desired pattern of conductive members of polycrystalline silicon were etched in a potassium hydroxide solution (40% by weight of potassium hydroxide in water saturated with isopropanol and heated to 60° C), it will be understood that variations in these proportions and temperature could easily be made without departing from the invention. In addition, other etches may be utilized, for example mixtures of chromic acid and hydrofluoric acid which have the selective etching properties of the potassium hydroxide solution.

While the invention has been described in specific embodiments, it will be understood that modifications may be made by those skilled in the art and it is intended by the appended claims to cover all such modifications and changes as fall within the true spirit and scope of the invention.

I claim:

1. A method of forming a conductive member of N-type and high conductivity polycrystalline silicon on a surface of an insulating substrate with at least one side thereof sloping gradually to said surface of the insulating substrate comprising forming a layer of polycrystalline silicon on said surface of the insulating substrate, forming a region of N-type and high conductivity including boron impurities in a concentration in excess of about $10^{18}$ atoms per cubic centimeter and extending from the exposed surface of said layer of polycrystalline silicon to the opposite surface thereof, said region having at least one generally planar side portion, said side portion of said region gradually sloping from the exposed surface of said layer of polycrystalline silicon to the opposite surface thereof and making a small acute angle with the base of said region lying on said surface of the insulating substrate, etching said layer of polycrystalline silicon with an etch which etches polycrystalline silicon containing boron impurities in excess of said concentration at a rate substantially less than the rate at which it etches polycrystalline silicon not containing boron impurities for a period of time to remove the portion of said layer of polycrystalline silicon not containing boron in excess of said concentration, whereby said region of said polycrystalline layer remains to provide said conductive member on said insulating substrate.

2. The method of claim 1 in which said region is formed by forming a mask of removed and retained portions on said layer of polycrystalline silicon for masking the introduction or boron impurities therein, said retained portion defining an exposed surface of said region in said layer of polycrystalline silicon, the diffusivity of boron in said layer of polycrystalline silicon varying in an inverse relationship with distance of the material from said surface of said insulating layer, introducing said boron impurities into said polycrystalline layer from said exposed surface and thereafter diffusing said boron impurities into said polycrystalline layer for a period of time to define said region.

3. The method of claim 2 in which said impurities of boron are introduced into said layer of polycrystalline silicon from said exposed surface by diffusion.

4. The method of claim 2 in which said impurities of boron are introduced into said layer of polycrystalline silicon from said exposed surface by ion implantation.

5. The method of claim 2 in which said region of said layer of polycrystalline silicon is provided with N-type conductivity prior to the introduction and diffusion of boron impurities thereinto by the introduction of donor impurities into said region in a concentration greater than the concentration of said boron impurities therein.

6. The method of claim 2 in which said region of polycrystalline silicon is provided with N-type conductivity subsequent to the introduction of boron impurities thereinto.

7. The method of claim 1 in which N-type and high conductivity is imparted to said region by the inclusion of phosphorus impurities therein, said phosphorus impurities being in a concentration in excess of 10 to 1 in relation to the concentration of said boron impurities in said region.

8. The method of claim 1, in which said insulating layer is constituted of silicon dioxide, in which N-type and high conductivity is imparted to said region by the inclusion of phosphorus impurities therein, and in which said polycrystalline layer is etched with an aqueous solution of 40 percent potassium hydroxide containing isopropanol.

* * * * *